(12) United States Patent
Tiemeijer

(10) Patent No.: US 11,024,483 B2
(45) Date of Patent: Jun. 1, 2021

(54) TRANSMISSION CHARGED PARTICLE MICROSCOPE WITH ADJUSTABLE BEAM ENERGY SPREAD

(71) Applicant: FEI Company, Hillsboro, OR (US)

(72) Inventor: Peter Christiaan Tiemeijer, Hillsboro, OR (US)

(73) Assignee: FEI Company, Hillsboro, OR (US)

(*) Notice: Subject to any disclaimer, the term of this patent is extended or adjusted under 35 U.S.C. 154(b) by 0 days.

(21) Appl. No.: 16/197,448

(22) Filed: Nov. 21, 2018

(65) Prior Publication Data
US 2019/0378680 A1    Dec. 12, 2019

(30) Foreign Application Priority Data
Nov. 27, 2017 (EP) .................... 17203708

(51) Int. Cl.
*H01J 37/26* (2006.01)
*H01J 37/244* (2006.01)
*H01J 37/10* (2006.01)
*H01J 37/20* (2006.01)
*H01J 37/22* (2006.01)

(52) U.S. Cl.
CPC .......... *H01J 37/244* (2013.01); *H01J 37/10* (2013.01); *H01J 37/20* (2013.01); *H01J 37/22* (2013.01); *H01J 37/26* (2013.01); *H01J 2237/1534* (2013.01); *H01J 2237/24485* (2013.01); *H01J 2237/2802* (2013.01)

(58) Field of Classification Search
None
See application file for complete search history.

(56) References Cited

U.S. PATENT DOCUMENTS

| | | | |
|---|---|---|---|
| 8,183,526 B1 | 5/2012 | Mankos | |
| 8,274,046 B1 | 9/2012 | Ren et al. | |
| 2008/0275655 A1* | 11/2008 | Moeck | G01N 23/04 702/27 |
| 2012/0080594 A1* | 4/2012 | Schnell | H01J 37/26 250/306 |
| 2013/0248699 A1* | 9/2013 | Mukai | H01J 37/023 250/252.1 |
| 2016/0196952 A1* | 7/2016 | Matsumoto | G01N 23/20058 250/305 |

FOREIGN PATENT DOCUMENTS

EP    2453461 A1    5/2012

OTHER PUBLICATIONS

Extended European Search Report for Application No. 17203708.7, dated May 23, 2018, 6 pages.

* cited by examiner

*Primary Examiner* — James Choi

(57) ABSTRACT

A transmission charged particle microscope includes a specimen holder for holding a specimen; a source for producing a charged particle beam; an illuminator for directing said beam to irradiate the specimen, wherein the illuminator comprising a monochromator and a condenser lens assembly; and an imaging system for receiving a flux of charged particles transmitted through the specimen. The microscope is controlled to produce a first energy spread of an emerging beam exiting said aperture by selecting at least one of parameters (a) an excitation of a first lens of said condenser lens assembly and (b) a width of a condenser aperture downstream of said first lens.

14 Claims, 4 Drawing Sheets

TRANSMISSION CHARGED PARTICLE MICROSCOPE WITH ADJUSTABLE BEAM ENERGY SPREAD

Figure 1:
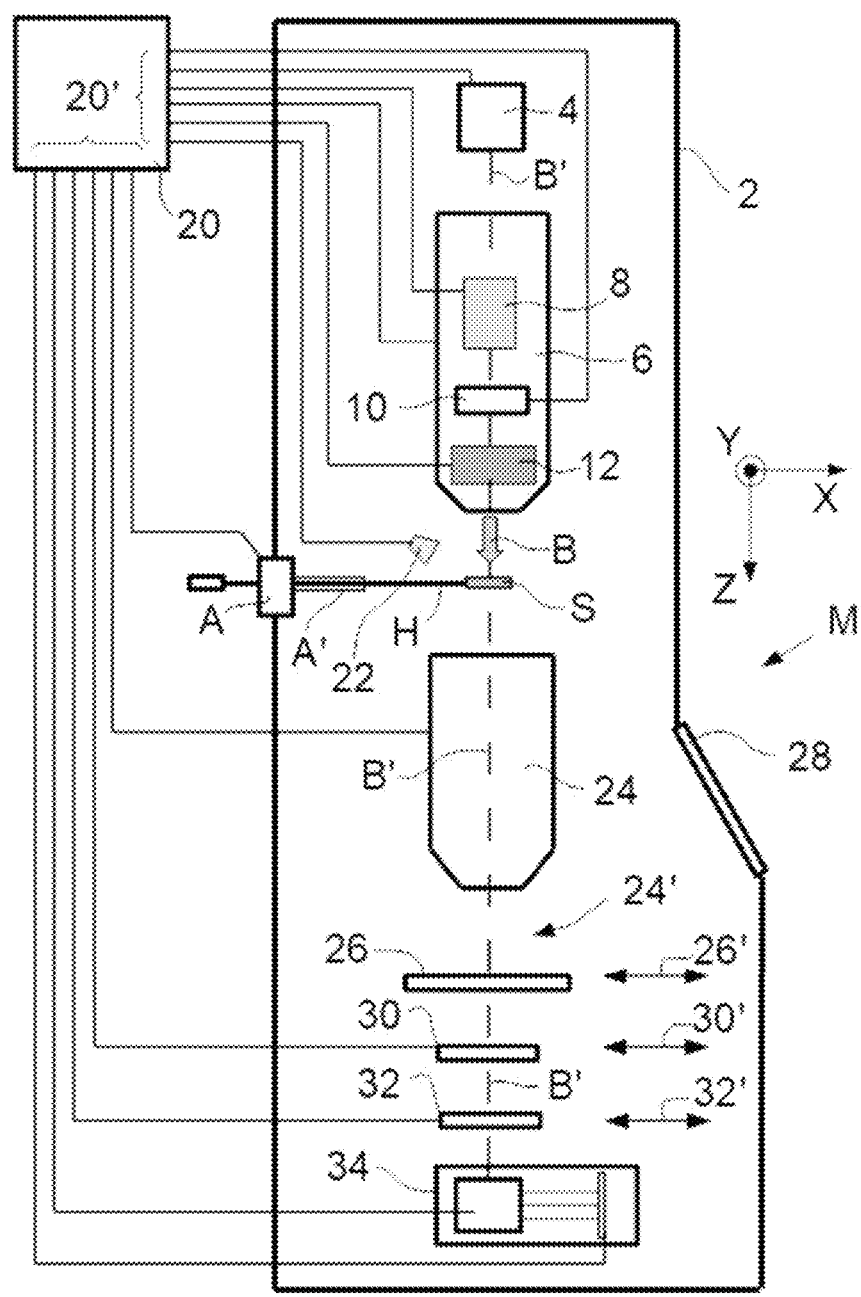

The invention relates to a method of using a Transmission Charged Particle Microscope comprising:
- A specimen holder, for holding a specimen;
- A source, for producing a beam of charged particles;
- An illuminator, for directing said beam along an optical axis so as to irradiate the specimen, the illuminator comprising:
  - a monochromator having a monochromator slit, and which is configured to produce an output beam with a given energy spread $\Delta E0$; and
  - a condenser lens assembly downstream of said monochromator;
- An imaging system, for receiving a flux of charged particles transmitted through the specimen and directing it onto a sensing device;
- A controller, for controlling at least some operational aspects of the microscope, The invention also relates to a Transmission Charged Particle Microscope in which such a method can be enacted.

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example. More specifically:

- In a SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.
- In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.

As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions (such as oxygen), protons and positrons, for instance.

It should be noted that, in addition to imaging and performing (localized) surface modification (e.g. milling, etching, deposition, etc.), a charged particle microscope may also have other functionalities, such as performing spectroscopy, examining diffractograms, studying ion channeling/ion backscattering (Rutherford Backscattering Spectrometry), etc.

In all cases, a Transmission Charged Particle Microscope (TCPM) will comprise at least the following components:
- A particle source, such as a Schottky electron source or ion source.
- An illuminator (charged particle beam column), which serves to manipulate a "raw" radiation beam from the source and perform upon it certain operations such as focusing, aberration mitigation, cropping (with a diaphragm), filtering, etc. It will generally comprise one or more (charged-particle) lenses, and may comprise other types of (particle-)optical component also. If desired, the illuminator can be provided with a deflector system that can be invoked to cause its exit beam to perform a scanning motion across the specimen being investigated. A (terminal) portion of the illuminator comprises a condenser lens assembly (of which the last lens is often referred to as the "objective lens" or "condensing objective lens"), which serves to define a beam footprint on the specimen; this assembly typically comprises one or more lenses/aperture plates. If desired—as is the case with the present invention—the illuminator may comprise a monochromator, which serves to narrow an energy spread of charged particles sent toward the specimen; such a monochromator typically comprises a dispersion device (such as a Wen filter, for example) that is exploited to allow exclusive selection of particles within a selected energy range—e.g. so as to curtail adverse effects of chromatic aberration on image quality, and/or to improve attainable resolution in Electron Energy-Loss Spectroscopy (EELS).
- A specimen holder, on which a specimen under investigation can be held and positioned (e.g. tilted, rotated). If desired, this holder can be moved so as to effect scanning motion of the specimen w.r.t. the beam. In general, such a specimen holder will be connected to a positioning system. When intended to hold cryogenic specimens, the specimen holder can be provided with a suitable cooling device.
- An imaging system, which essentially takes charged particles that are transmitted through a specimen (plane) and directs (focuses) them onto a sensing device, such as a detection/imaging device (camera), spectroscopic apparatus (such as an EELS module), etc. As with the illuminator referred to above, the imaging system may also perform other functions, such as aberration mitigation, cropping, filtering, etc., and it will generally comprise one or more charged-particle lenses and/or other types of particle-optical components.

When a spectroscopic apparatus as referred to here is present, it will generally comprise:
- A dispersing device (e.g. comprising one or more "charged-particle prisms"), to disperse an incoming flux of charged particles (from the imaging system) into an energy-resolved (continuous) array of spectral sub-beams, which can ultimately be directed onto a detection surface so as to form a spectrum. Basically, said incoming flux will contain charged particles of various energies, and the dispersing device will "fan these out" (along a dispersion direction) into a (continuous) collection/array of sub-beams of given energies (in a manner somewhat reminiscent of a mass spectrometer).

It should be noted that the employed sensing device may be unitary or compound/distributed in nature, and can take many different forms, depending on what it is intended to sense. It may, for example, comprise one or more photodiodes, CMOS detectors, CCD detectors, photovoltaic cells, etc.

In what follows, the invention may be set forth in the specific context of electron microscopy; however, such simplification is intended solely for clarity/illustrative purposes, and should not necessarily be interpreted as limiting.

An example of a TCPM as set forth above is a (S)TEM that is provided with an EELS module. EELS is a technique used in (S)TEMs to obtain elemental/chemical information pertaining to a given specimen. A moving electron in an irradiating beam (from the (S)TEM's illuminator) can transfer energy to a bound electron in a core shell of an atom in the specimen, and promote this core electron to an outer shell (inelastic scattering). This energy transfer from the moving electron gives rise to a so-called "core-loss peak" (CLP) in the EELS spectrum. The (coarse) position (in energy units) of the CLP is element-specific, and its precise position and shape are specific to the element's chemical environment and bonding. In addition to the CLPs referred to above, an EELS spectrum will generally also contain so-called "Plasmon Resonance Peaks" (PRPs), i.e. a relatively broad series of peaks/shoulders associated with single or multiple scattering of electrons on plasmons in the specimen. These PRPs typically lie in the energy range 0-50 eV. Typically, EELS modules can also be used as energy-selective imaging devices (EFTEMs: Energy-Filtered TEMs). To achieve this, they employ a slit ("letterbox") at/proximal their (primary) spectrum plane. When the module is used as a pure spectrometer, this slit is retracted, and the spectrum plane can be magnified and imaged onto the employed detector (camera) using post-dispersion optics. On the other hand, when the module is used as an energy-selective imaging device, the slit can be invoked to pass/admit only a specific energy window (typically of the order of 10-50 eV wide); in that case, the post-dispersion (post-slit) optics then image a Fourier Transform plane of said spectrum plane onto the detector.

Recent years have shown a strong increase of interest in the use of EELS to map plasmons, phonons and/or bandgaps in specimens. Contrary to 'standard' (core-loss) monochromated EELS—which is done at typical resolutions of the order of ca. 0.1 eV-1.0 eV—'high-resolution' (phonon/plasmon/bandgap) EELS requires a much better resolution, e.g. in a range of about 0.005-0.030 eV. Such resolutions cannot be obtained using a conventional monochromator, because its inevitable optical aberrations cause an undesirable increase in beam energy spread as a function of increasing excitation (of the monochromator). One way to tackle such aberrations would be to reduce the beam diameter in the monochromator by using a curtailing entrance aperture. However:

Constructing a variable entrance aperture to fulfill this function (e.g. as set forth in U.S. Pat. No. 5,838,004) would be complicated, due to the high-voltage and ultra-high vacuum in the vicinity of where the aperture would typically need to be located;

Simply using a fixed entrance aperture of a relatively small size would be undesirable, because it would cause an excessive reduction in beam current for 'standard' EELS.

It is an object of the invention to address these issues. More specifically, it is an object of the invention to provide a method/apparatus that allows a sizeable reduction in beam energy spread without having to rely on modifying an entrance aperture of an employed monochromator. In particular, it is an object of the invention that said method/apparatus should allow easy adjustability of said beam energy spread, as desired.

These and other objects are achieved in a method as set forth in the opening paragraph above, characterized by the following steps:

In a first use session, selecting at least one of:
(a) an excitation of a first lens (C1) of said condenser lens assembly;
(b) a width (i.e. size) of a condenser aperture (CA) downstream of said first lens, so as to produce a first width W1—and associated first energy spread $\Delta E1$—of an emerging beam exiting said aperture;

In a second use session, selecting at least one of said parameters (a) and (b) so as to produce a second, different width W2—and associated second, different energy spread $\Delta E2$—of said emerging beam.

The invention is thus able to leave the monochromator (with its associated output-beam energy spread $\Delta E0$) alone/unchanged and nevertheless achieve a selectable/adjustable energy spread $\Delta En$ incident on the specimen, whereby $\Delta En$ can be chosen to have one or more values $\leq \Delta E0$ as desired/required ($n \in \{1, 2, \ldots\}$); so, for example, one could select $\Delta E1$ to be significantly less than $\Delta E0$ for a high-resolution EELS analysis, and could then revert to $\Delta E2 \sim \Delta E0$ for a standard-resolution analysis, for instance. The invention effectively realizes a sort of "two-stage" monochromation effect—with the first (fixed) stage occurring in the monochromator itself, and a second (variable) stage occurring in the (downstream) condenser.

Another way of understanding the invention is to realize that it serves to create an adjustable virtual image of said condenser aperture (CA) at the location of the monochromator, so that the condenser aperture acts as a variable virtual aperture for the monochromator. The size (and/or shape) of this virtual aperture can be adjusted in one or both of the following ways:

By varying the excitation of the first condenser lens (C1 lens; located between the monochromator and condenser aperture CA); and/or By changing the size of the condenser aperture CA, e.g. by using an exchanger to swap a different condenser aperture CA into the beam path, or by using an adjustable diaphragm-like aperture.

Both such operations are much easier than trying to realize a real variable aperture at the location of the monochromator, and are more flexible than employing a fixed monochromator aperture. It should be noted that the exact location of the abovementioned virtual aperture will be influenced by the specific implementation of the condenser lens assembly; depending on the implementation chosen, the virtual aperture may, for example, be at or proximal to an entrance plane of the monochromator, an exit plane of the monochromator, or a location between these two planes.

So as to give some general (non-binding) guidance, the following is noted.

(i) To achieve $\Delta En \sim \Delta E0$ (substantially unaltered monochromator output), one can ensure that the condenser aperture CA has no major curtailing/throttling effect on the beam leaving the monochromator. This can be achieved by selecting a relatively wide condenser aperture CA and/or by exciting lens C1 so as to produce a relatively narrow output beam at the plane of CA (see FIG. 3A, for example).

(i) To achieve $\Delta En < \Delta E0$ (improved monochromatic beam), one can ensure that the condenser aperture CA has a significant curtailing/throttling effect on the beam leaving the monochromator. This can be achieved by selecting a relatively narrow condenser aperture CA and/or by exciting lens C1 so as to produce a relatively wide output beam at the plane of CA (see FIG. 3B, for example). In this way, only a relatively confined central portion of the beam at the entrance side of aperture CA is actually passed by CA toward the specimen, thereby effecting further wavelength range selection (inter alia by curtailing effects of aberrations occurring in the monochromator). The narrower aperture CA and/or broader the output beam from C1, the narrower will be this wavelength range selection.

For example:
  Scenario (i) could be used to provide a specimen-level beam with an energy spread of the order of $\Delta E0 \geq 0.1$ eV, which is useful for "standard" EELS/imaging.
  Scenario (ii) could be used to provide a specimen-level beam with an energy spread of the order of $\Delta En < 0.05$ eV, preferably <0.03 eV, for high-resolution EELS/imaging with low chromatic aberration.

Of course, because of the smaller virtual monochromator aperture in scenario (ii), the current in the specimen-level beam is significantly smaller in scenario (ii) than in scenario (i). Generally, this smaller beam current is not limiting upon the EELS experiments, because those phenomena which require an energy spread of the order of $\Delta En < 0.05$ eV (such as phonons, plasmons and bandgaps) tend to have much stronger interaction with the electron beam than the phenomena which are studied in "standard EELS" (such as core-loss peaks).

In a particular embodiment of the invention, a second lens (C2) of said condenser lens assembly is disposed between said first lens (C1) and said condenser aperture (CA). Such a second lens C2 can, for example, serve to convert a divergent beam leaving lens C1 into a (semi-)collimated beam (e.g. with a (semi-)uniform width of the order of ca. 50 μm) before it impinges on the condenser aperture CA. This can facilitate efficient beam entry into further optics situated downstream of the condenser aperture CA, such as an objective lens, for example.

The skilled artisan will understand that adjustments to parameters (a) and/or (b) according to the present invention can be made manually (e.g. by selecting particular values in a user interface menu, or turning a (real or virtual) "knob") or automatically (e.g. by a controller/processor that is configured/programmed to autonomously select given parameter values dependent on the type of analysis being performed—for instance, as indicated in a user interface menu/batch recipe).

It should be explicitly noted that the usefulness/applicability of the present invention is not limited to high-resolution EELS; in addition/alternatively, it should be realized that it allows low-chromatic-aberration imaging, for example.

The invention will now be elucidated in more detail on the basis of exemplary embodiments and the accompanying schematic drawings, in which:

FIG. 1 renders a longitudinal cross-sectional elevation view of an embodiment of a TCPM in which the present invention is implemented.

Figure 2:
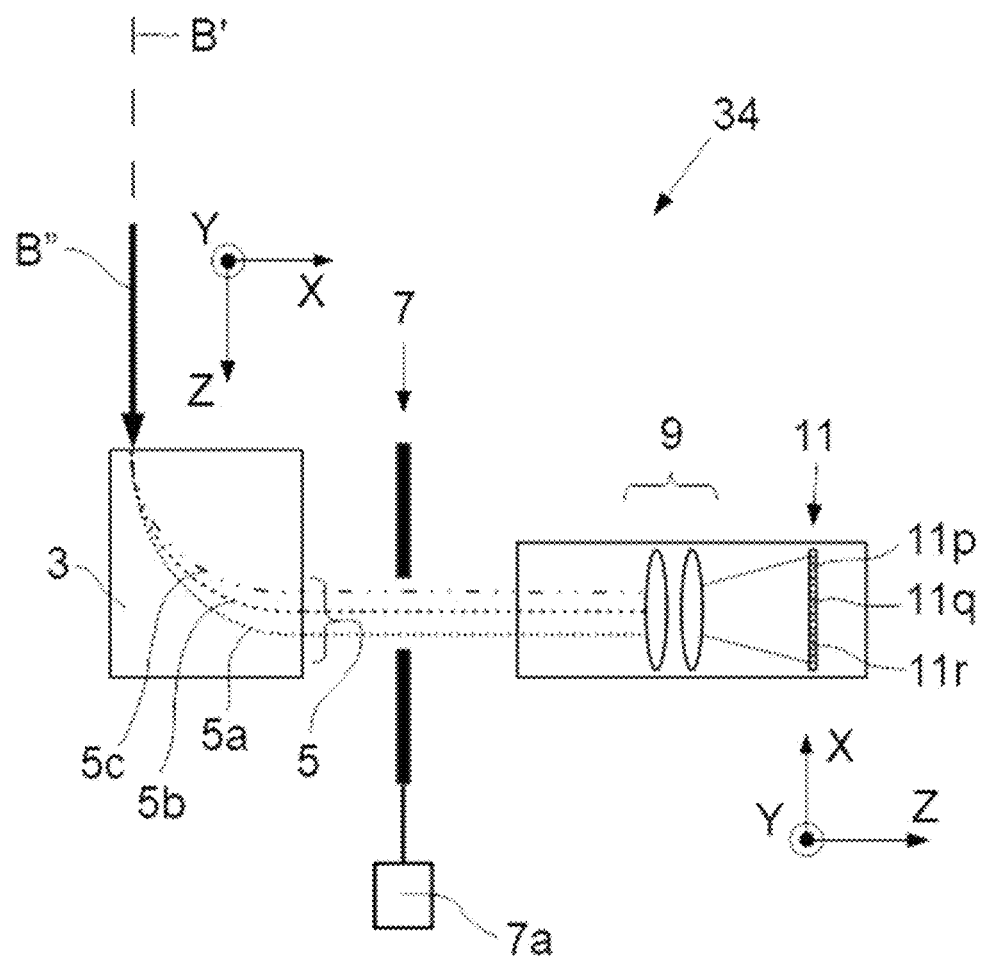

FIG. 2 shows an enlarged and more detailed view of part of FIG. 1, more particularly an EELS module.

Figure 3A:
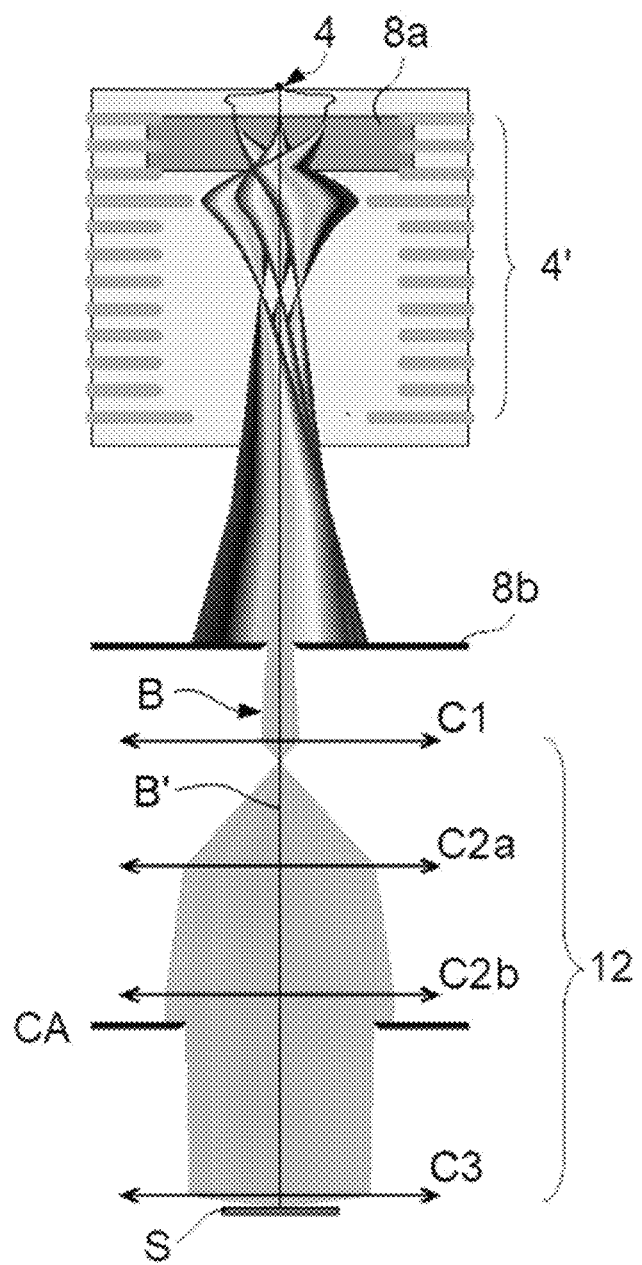

FIG. 3A renders a magnified view of an upper portion of FIG. 1, depicting operation according to a first embodiment of the present invention.

Figure 3B:
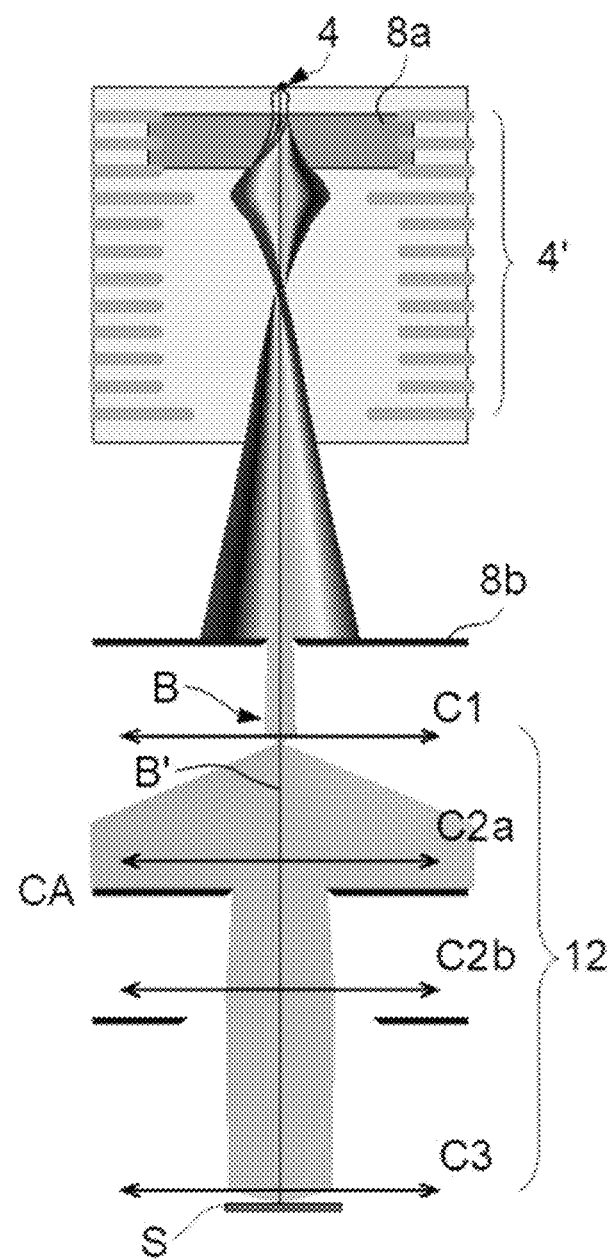

FIG. 3B corresponds largely to FIG. 3A, but depicts operation according to a second embodiment of the current invention.

In the Figures, where pertinent, corresponding parts are indicated using corresponding reference symbols.

EMBODIMENT 1

FIG. 1 (not to scale) is a highly schematic depiction of an embodiment of a TCPM M in which the present invention is implemented; more specifically, it shows an embodiment of a TEM/STEM. In the Figure, within a vacuum enclosure 2, an electron source 4 produces a beam B of electrons that propagates along an electron-optical axis B' and traverses an electron-optical illuminator (charged particle beam column) 6, serving to direct/focus the electrons onto a chosen part of a specimen S (which may, for example, be (locally) thinned/planarized). Also depicted is a deflector 10, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be illuminated/imaged/inspected by the electron beam B traveling along axis B' (in the Z direction), and/or allows scanning motion to be performed as an alternative to beam scanning. If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen (sensing device) 26, which, if desired, can be retracted/withdrawn (as schematically indicated by arrows 26') so as to get it out of the way of axis B'. An image or diffractogram of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image/diffractogram on screen 26, one can instead make use of the fact that the depth of focus of the electron flux leaving imaging system 24 is generally quite large (e.g. of the order of 1 meter). Consequently, various other types of sensing device can be used downstream of screen 26, such as:

TEM camera 30. At camera 30, electron flux B" can form a static image or diffractogram that can be processed by controller/processor 20 and displayed on a display device (not depicted), such as a flat panel display, for example. When not required, camera 30 can be retracted/withdrawn (as schematically indicated by arrows 30') so as to get it out of the way of axis B'.

STEM camera 32. An output from camera 32 can be recorded as a function of (X,Y) scanning position of the beam B on the specimen S, and an image can be constructed that is a "map" of output from camera 32 as a function of X,Y. Camera 32 can comprise a single pixel with a diameter of e.g. 20 mm, as opposed to the matrix of pixels characteristically present in camera 30. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).

As an alternative to imaging using cameras 30 or 32, one can also invoke spectroscopic apparatus 34, which, in the current example, is an EELS module.

It should be noted that the order/location of items 30, 32 and 34 is not strict, and many possible variations are conceivable. For example, spectroscopic apparatus 34 can also be integrated into the imaging system 24.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, camera 32, spectroscopic apparatus 34, etc.

Turning now to FIG. 2, this shows an enlarged and more detailed view of the spectroscopic apparatus 34 in FIG. 1. In the Figure, flux B" of electrons (which has passed through specimen S and imaging system 24) is shown propagating along electron-optical axis B'. The flux B" enters a dispersing device 3 ("electron prism"), where it is dispersed (fanned out) into an energy-resolved/energy-differentiated (continuous) array 5 of spectral sub-beams (schematically indicated in FIG. 2 using broken lines), which are distributed along dispersion direction X; for illustration purposes, three of these sub-beams are labelled 5a, 5b and 5c in the Figure. Note in this regard that, conventionally, propagation is considered to occur along the Z direction, and the depicted Cartesian coordinate system thus "co-deflects with" the flux B" within the dispersing device 3.

Downstream of item 3, the array 5 of sub-beams encounters an adjustable/retractable slit (letterbox) 7, which can, for example, be used in EFTEM-mode to select/admit a given portion of the array 5 and to discard/occlude other portions thereof; to this end, the slit 7 is connected to an actuation device 7a that can be invoked to open/close/move the (opening in the) slit 7 as desired. In EELS mode, this slit 7 is usually (fully) open/retracted. The skilled artisan will understand that the slit 7 is advantageously disposed at a location at or proximal to a dispersion plane of the spectroscopic apparatus 34; similarly, the detector 11 is also advantageously located at or proximal to such a plane. If required, it is possible to aim/shift the array 5 of spectral sub-beams falling upon the slit 7 by appropriately adjusting, for example, (an electrical signal to) the dispersing device 3 and/or a drift tube/deflector (not depicted) provided between the dispersing device 3 and slit 7, for instance.

After having traversed slit 7, the (selected portion of the) array 5 passes through post-dispersion electron optics 9, where it is magnified/focused, for example, and ultimately directed/projected onto detector 11, with sub-beams 5a, 5b and 5c respectively impinging upon detector portions 11r, 11q and 11p.

Two particular components of illuminator 6 are of specific importance as regards the present invention, namely monochromator 8 and condenser lens assembly 12 (see FIG. 1), and the contribution of these components will now be described in detail. FIGS. 3A and 3B render a magnified view of an upper portion of FIG. 1. In both Figures, the source 4 radiates rays (charged particle paths) in a variety of directions, and these are "captured" and accelerated by a series of anode electrodes 4'. Each ray passes into disperser/particle prism 8a, where dispersion occurs, i.e. a differential deflection that depends on the exact energy of the particle passing along a given nominal path/ray, which causes a spectral spread in the various rays. A monochromator slit 8b is used to select a relatively narrow sub-section of this spectral spread, thus passing only a selected energy range $\Delta E0$. In the particular set-up shown in FIGS. 3A and 3B, this monochromator slit 8b is positioned at ground potential after the accelerator anodes 4', which facilitates the construction of the slit; however, in an alternative set-up, the monochromator slit 8b can, for example, be positioned in or proximal to the dispersive element of the monochromator.

A beam with said energy spread $\Delta E0$ next enters condenser assembly 12, which comprises various condenser lenses C1, C2a, C2b, C3 and a condenser aperture CA, and is (ultimately) directed onto specimen S. However, there are significant differences between FIGS. 3A and 3B, and these can be set forth as follows:

In FIG. 3A, the beam B emerging from monochromator slit 8b is relatively mildly expanded by condenser lens C1, so that all (or a very large central portion thereof) passes through condenser aperture CA. If desired, aperture CA can be used to "clean up" the beam, by blocking a small peripheral/annular region thereof, but this has only a relatively small effect on the total percentage of the beam footprint that is passed by the aperture CA.

In FIG. 3B, the beam B emerging from monochromator slit 8b is more strongly expanded by condenser lens C1 (and/or a relatively small condenser aperture CA is selected), so that only a relatively small central portion of the beam passes through aperture CA. This has a significant effect on the total percentage of the beam footprint that is passed by the aperture CA, with an attendant reduction in beam energy spread.

The invention claimed is:

1. A method of using a Transmission Charged Particle Microscope comprising:
   providing a source, for producing a beam of charged particles;
   providing an illuminator, for directing said beam along an optical axis so as to irradiate a specimen, wherein the illuminator comprises
   a monochromator having a series of accelerator anodes positioned upstream of a monochromator slit and which is configured to produce an output beam with a given energy spread $\Delta E0$, and
   a condenser lens assembly including one or more condenser lenses and a condenser aperture downstream of said monochromator, said condenser lens assembly not containing an accelerator, wherein different widths of said condenser aperture cause different curtailing of aberrations occurring in the monochromator;
   providing an imaging system, for receiving a flux of charged particles transmitted through the specimen and directing it onto a sensing device;
   providing a controller, for controlling at least some operational aspects of the microscope, wherein the controller is configured to perform a method including:
   in a first use session, producing a first width W1 and associated first energy spread $\Delta E1$ of an emerging beam exiting said condenser aperture by adjusting at least one of (a) an excitation of a first lens of said condenser lens assembly and (b) a width of a condenser aperture downstream of said first lens; and
   in a second use session, producing a second, different width W2 and associated second, different energy spread $\Delta E2$ of said emerging beam by adjusting at least one of said parameters (a) and (b).

2. A method according to claim 1, wherein adjustment of at least one of parameters (a) and (b) causes a virtual image of said condenser aperture, formed at a location of said monochromator, to vary in width.

3. A method according to claim 1, wherein a second lens of said condenser lens assembly is disposed between said first lens and said condenser aperture.

4. A method according to claim 1, wherein at least one of $\Delta E1$ and $\Delta E2$ is less than 0.05 eV.

5. A method according to claim 4, wherein $\Delta E0 \geq 0.1$ eV.

6. A method according to claim 1, wherein said sensing device is comprised in an Electron Energy Loss Spectroscopy (EELS) module.

7. A Transmission Charged Particle Microscope, comprising:
   a source, for producing a beam of charged particles;
   an illuminator, for directing said beam along an optical axis so as to irradiate a specimen, the illuminator comprising a monochromator having a series of accelerator anodes positioned upstream of a monochromator slit that is configured to produce an output beam with a given energy spread $\Delta E0$ and a condenser lens assembly downstream of said monochromator, said condenser lens assembly including one or more condenser lenses and a condenser aperture, said condenser lens assembly not containing an accelerator, wherein different widths of said condenser aperture cause different curtailing of aberrations occurring in the monochromator;
   an imaging system, for receiving a flux of charged particles transmitted through the specimen and directing it onto a sensing device;
   a controller, for controlling at least some operational aspects of the microscope,
   wherein said controller is configured to:
   in a first use session,
   producing a first width W1 and associated first energy spread $\Delta E1$ of an emerging beam exiting said condenser aperture by adjusting at least one of (a) an excitation of a first lens of said condenser lens assembly and (b) a width of a condenser aperture downstream of said first lens; and
   in a second use session, producing a second, different width W2 and associated second, different energy spread $\Delta E2$ of said emerging beam by adjusting at least one of said parameters (a) and (b).

8. The Transmission Charged Particle Microscope of claim 7, wherein adjustment of at least one of parameters (a) and (b) causes a virtual image of said condenser aperture, formed at a location of said monochromator, to vary in width.

9. The Transmission Charged Particle Microscope of claim 7, wherein a second lens of said condenser lens assembly is disposed between said first lens and said condenser aperture.

10. The Transmission Charged Particle Microscope of claim 7, wherein at least one of $\Delta E1$ and $\Delta E2$ is less than 0.05 eV.

11. The Transmission Charged Particle Microscope of claim 10, wherein $\Delta E0 \geq 0.1$ eV.

12. The Transmission Charged Particle Microscope of claim 7, wherein said sensing device is comprised in an Electron Energy Loss Spectroscopy (EELS) module.

13. The method according to claim 1, wherein at least one of the first energy spread $\Delta E1$ and the second energy spread $\Delta E2$ is less than the energy spread $\Delta E0$.

14. The Transmission Charged Particle Microscope of claim 7, wherein at least one of the first energy spread $\Delta E1$ and the second energy spread $\Delta E2$ is less than the energy spread $\Delta E0$.

* * * * *